United States Patent
Achter et al.

(10) Patent No.: US 9,142,270 B2
(45) Date of Patent: Sep. 22, 2015

(54) PIPELINING IN A MEMORY

(71) Applicant: Spansion LLC, Sunnyvale, CA (US)

(72) Inventors: Michael Achter, Mountain View, CA (US); Evrim Binboga, Pleasanton, CA (US); Marufa Kaniz, Santa Clara, CA (US); Murni Mohd-Salleh, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 194 days.

(21) Appl. No.: 13/790,979

(22) Filed: Mar. 8, 2013

(65) Prior Publication Data

US 2014/0254288 A1   Sep. 11, 2014

(51) Int. Cl.
G11C 7/00 (2006.01)
G11C 7/12 (2006.01)
G11C 7/10 (2006.01)
G11C 29/02 (2006.01)

(52) U.S. Cl.
CPC ............. G11C 7/12 (2013.01); G11C 7/1039 (2013.01); G11C 29/023 (2013.01); G11C 29/028 (2013.01)

(58) Field of Classification Search
CPC ........ G11C 29/808; G11C 8/08; G11C 5/145; H05K 999/99
USPC ................................ 365/200, 189.11, 185.22
See application file for complete search history.

(56) References Cited

U.S. PATENT DOCUMENTS

| 6,134,145 | A | 10/2000 | Wong | |
|---|---|---|---|---|
| 7,492,641 | B2 * | 2/2009 | Hosono et al. | 365/185.22 |
| 2003/0206451 | A1 * | 11/2003 | Tanaka et al. | 365/200 |
| 2005/0248986 | A1 | 11/2005 | Wong | |
| 2007/0255891 | A1 | 11/2007 | Chow et al. | |
| 2010/0309180 | A1 * | 12/2010 | Chang et al. | 345/208 |
| 2011/0078387 | A1 | 3/2011 | Chiras et al. | |
| 2012/0026791 | A1 | 2/2012 | Li | |
| 2012/0294074 | A1 * | 11/2012 | Hurkx et al. | 365/163 |
| 2014/0036595 | A1 * | 2/2014 | Binboga | 365/185.19 |

OTHER PUBLICATIONS

International Search Report and Written Opinion of the International Searching Authority for International Application No. PCT/US2014/021255, mailed May 26, 2014.

Kim, C., et al., "A 21 nm High Performance 64 Gb MLC NAND Flash Memory With 400 MB/s Asynchronous Toggle DDR Interface", IEEE Journal of Solid-State Circuits, vol. 47, No. 4, pp. 981-989, 2012.

* cited by examiner

Primary Examiner — Huan Hoang
Assistant Examiner — Minh Dinh

(57) ABSTRACT

A system including a memory cell array including a plurality of memory cells, and a writing device to generate multiple back-to-back write pulses to write to target memory cells from among the plurality of memory cells, the multiple back-to-back write pulses overlapping during an overlap duration, the overlap duration being adjustable based on a performance parameter of the memory cell array.

18 Claims, 8 Drawing Sheets

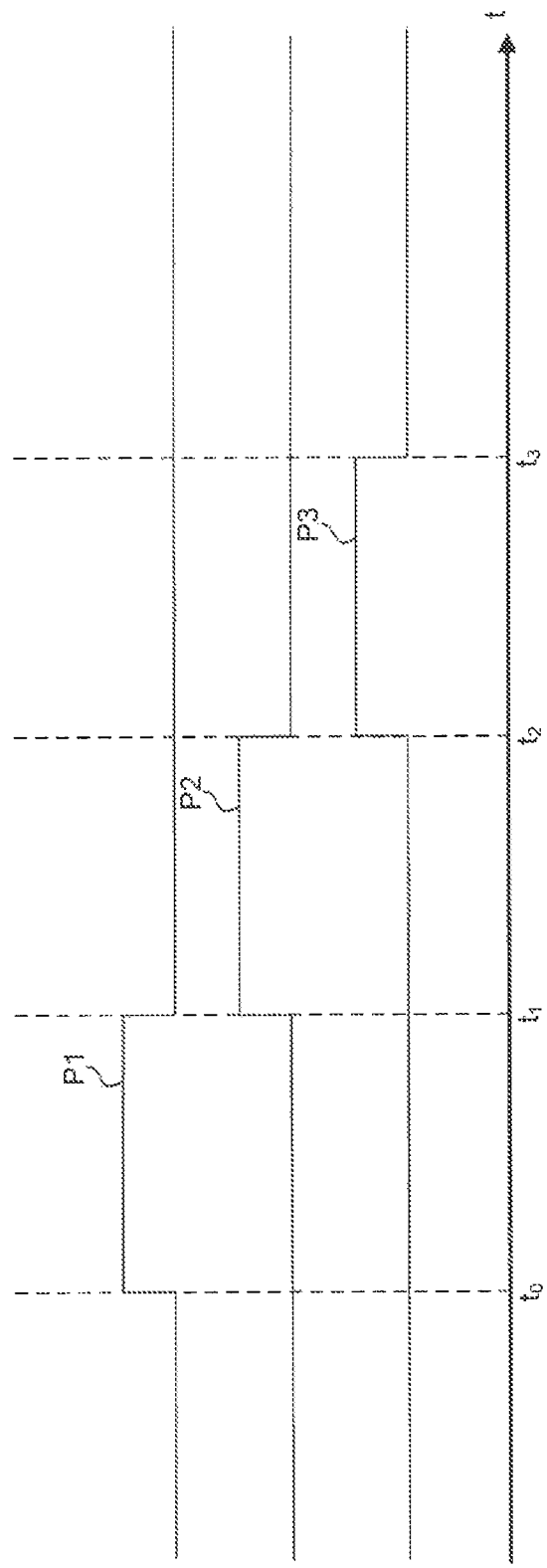
FIG. 2
Conventional

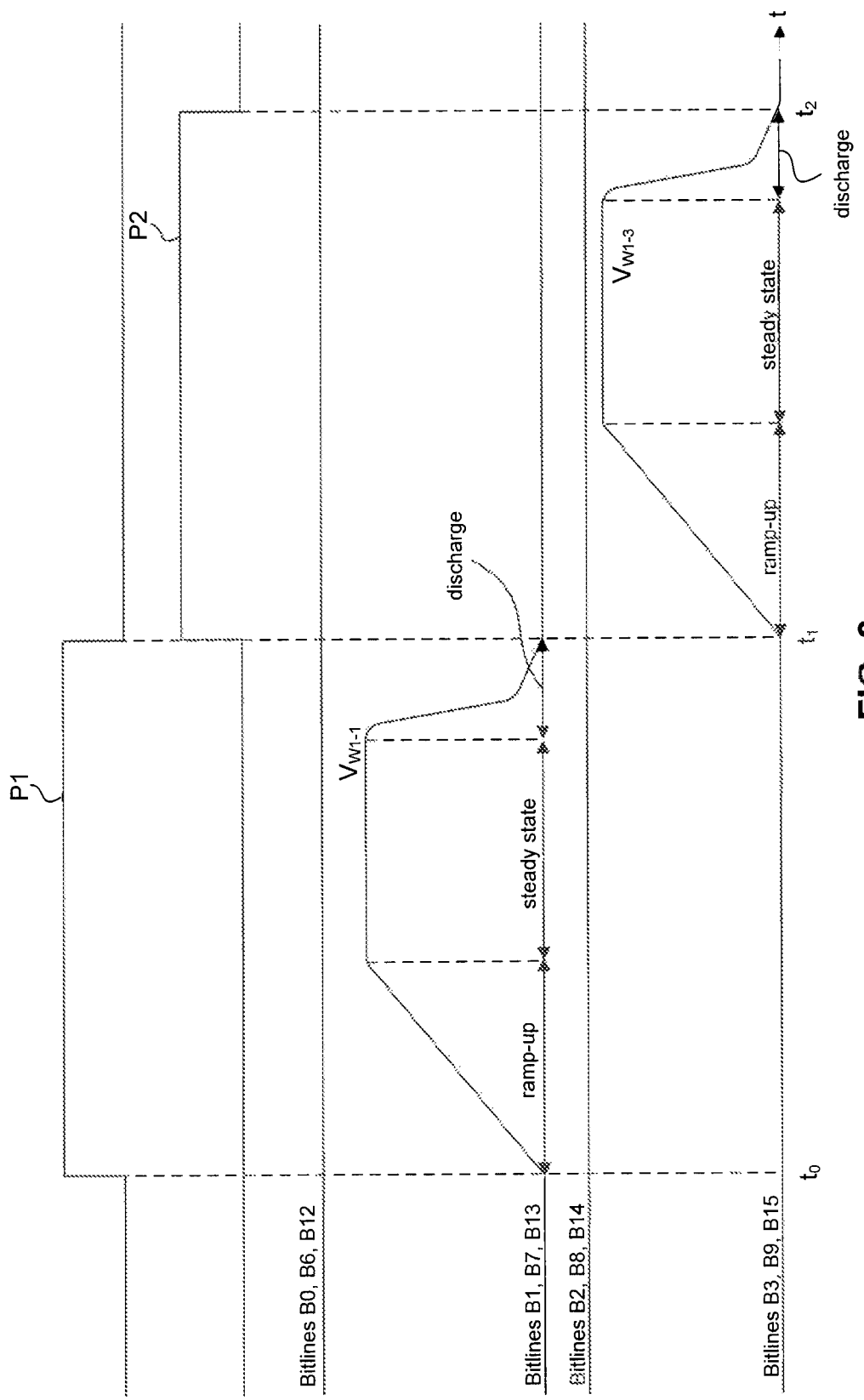
FIG. 3
Conventional

PIPELINING IN A MEMORY

BACKGROUND

Field

The present disclosure generally relates to pipelining in a memory that allows pre-charging or partially operating on a next target location in the memory while operating on a current target location in the memory. Operating on a target location may include programming data to the target location or erasing data from the target location. As discussed below, the above pipelining improves, for example, the throughput associated with the memory.

BRIEF SUMMARY

Systems, methods, and computer program products for pipelining in a memory are described herein.

In an embodiment of the present disclosure, a system includes a first memory cell, a second memory cell, and a programming device. The programming device is configured to generate respective first and second programming pulses to program the first and second memory cells. The first and second programming pulses overlap during an overlap duration, the overlap duration being adjustable based on a performance parameter of the first and second memory cells.

The present disclosure also contemplates a method including generating respective first and second programming pulses to program first and second memory cells, the first and second programming pulses overlapping during an overlap duration that may be adjusted based on a performance parameter of the first and second memory cells, and programming the first and second memory cells using the first and second programming pulses.

Further features and advantages of the disclosure, as well as the structure and operation of various embodiments of the invention, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate embodiments of the present invention and, together with the description, further serve to explain the principles of the invention and to enable a person skilled in the relevant art(s) to make and use embodiments of the invention.

FIG. 2 illustrates programming pulses used to respectively program identified memory cells in a memory.

FIG. 3 illustrates programming of the identified memory cells.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Figure 1:
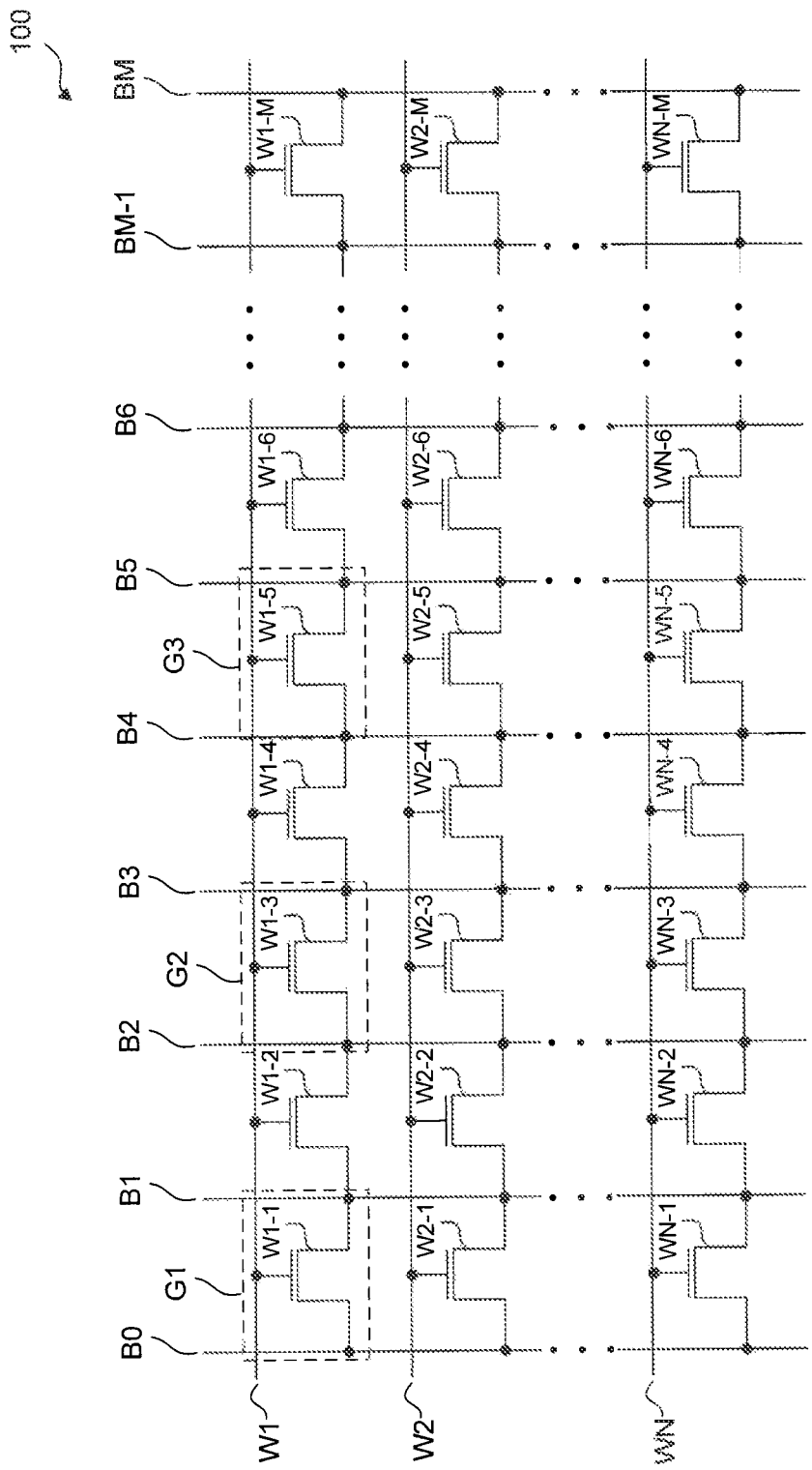
FIG. 1 illustrates an exemplary memory sector comprising memory cells in the form of non-volatile memory cells, according to an embodiment of the present disclosure.

FIG. 1 illustrates an exemplary memory sector 100 comprising memory cells, e.g., in the form of non-volatile memory cells, according to an embodiment of the present disclosure. The memory sector 100 includes a plurality of Wordlines W1 . . . WN, where N is an integer number. The Wordlines W1 . . . WN are connected to respective gates of M number of memory cells in the form of non-volatile memory cells, where M is an integer number. For example, the Wordline W1 is connected to the respective gates of non-volatile volatile memory cells W1-1, W1-2 . . . W1-M, Wordline W2 is connected to the respective gates of non-volatile memory cells W2-1, W2-2 . . . .W2-M, and so on. In this way, each Wordline is connected to M number of memory cells. Further, the memory sector 100 includes a plurality of Bitlines B1 . . . BM, which are connected to respective sources and drains of N number of the non-volatile memory cells. For example, Bitline B1 is connected to respective drains of floating gate transistors W1-1, W2-1 . . . WN-1 and is connected to respective sources of non-volatile memory cells W1-2, W2-2 . . . WN-2, Bitline B2 is connected to respective drains of non-volatile memory cells W1-2, W2-2 . . . WN-2 and is connected to respective sources of nonvolatile memory cells W1-3, W2-3 . . . WN-3, and so on. In one embodiment, the non-volatile memory cells may include floating gate transistors.

In one example, operations on the memory cells comprised in the memory sector 100 include programming data to the memory cells and/or erasing data from the memory cells. In a given sector, data may be programmed to or data may be erased from only the memory cells connected to a single wordline at a given time. The presently proposed pipelining is applicable to programming data to memory cells and also to erasing data from memory cells.

The presently proposed pipelining with respect to programming data to memory cells will now be discussed. Programming of memory cells may be conducted using a method known as a hot electron injection method. In one example using the hot electron injection method, memory cells may be programmed or written to sequentially. The memory cells may be partitioned into groups, and the groups may be programmed sequentially. For example, a controller (not shown) may identify the memory cells that are to be programmed and may partition the identified memory cells into groups. Once the groups are partitioned, the controller may determine the locations of all the memory cells within the groups. For example, a first group G1 may include memory cells W1-1, W1-7 (not shown), and W1-13 (not shown); a second group G2 may include memory cells W1-3, W1-9 (not shown), and W1-15 (not shown); and a third group (G3 may include memory cells W1-5, W1-11 (not shown), and W1-17 (not shown). To program the identified memory cells of a given group, a voltage associated with the wordline connected to the identified target memory cells may initially be ramped up to a first voltage. Then, voltages associated with the bitlines connected to the drains of the target memory cells are ramped up to a second voltage level, while the bitlines connected to the sources of the target memory cells are maintained at a very low voltage (e.g., near ground) level.

The above voltage levels at the wordline and the bitlines enable the operation of the associated non-volatile memory cells. Now, when the memory cells included in the first group G1, the second group G2, and the third group G3 are to be programmed, the controller determines the locations of the memory cells included in the first group G1, the second group G2, and the third group G3.

FIG. 2 illustrates conventional programming pulses P1, P2, and P3 used to respectively program corresponding memory cells, e.g., memory cells in the first group G1, the second group G2, and the third group G3. The programming pulses P1, P2, and P3 are sequentially generated to enable programming of the memory cells in the first group G1, the second group G2 in the third group G3 one after another. In particular, programming pulse P1 is asserted at time t0 to enable programming of memory cells W1-1, W1-7, and W1-13 included in the first group G1, and is de-asserted at time t1 when memory cells W1-1, W1-7, and W1-13 have been programmed. Programming pulse P2 is then asserted at time t1 to enable programming of memory cells W1-3, W1-9, and W1-15 included in the second group G2, and is de-asserted at time t2 when memory cells W1-3, W1-9, and W1-15 have been programmed. Finally, programming pulse P3 is asserted at time t2 to enable programming of memory W1-5, W1-11, and W1-17, and is de-asserted at time t3 when memory cells W1-5, W1-11, and W1-17 have been programmed. In this way, the identified memory cells in groups G1, G2, and G3 are sequentially enabled to be programmed one after another.

FIG. 3 illustrates conventional programming of the identified memory cells in further detail, as compared to FIG. 2. The description of FIG. 3 will again refer to the elements in FIG. 1. The voltage associated with Wordline W1 is initially ramped up to the first voltage level. Then, at time t0, voltages associated with bitlines B0, B6, and B12 (not shown), which are respectively connected to the sources of the target memory cells W1-1, W1-7, and W1-13 are maintained at a very low voltage level and the programming pulse P1 is asserted to ramp-up the voltages associated with bitlines B1, B7 (not shown), and B13 (not shown) which are respectively connected to the drains of the target memory cells W1-1, W1-7, and W1-13. Once the voltages associated with bitlines B1, B7, and B13 reach a predetermined steady-state level (e.g., $V_{W1-1}$), the memory cells W1-1, W1-7, and W1-13 are programmed. The voltages associated with bitlines B1, B7 and B13 are then discharged. At time t1, after the target memory cells W1-1, W1-7, and W1-13 are programmed, the programming pulse P1 may be de-asserted. Also, at time t1, voltages associated with bitlines B2, B8 (not shown), and B14 (not shown), which are respectively connected to the sources of the target memory cells W1-3, W1-9, and W1-15 are maintained at a very low voltage level and the programming pulse P2 to program target memory cells W1-3, W1-9 and W1-15 is asserted to ramp-up the voltages associated with bitlines B3, B9 (not shown), and B15 (not shown) which are respectively connected to the drains of the target memory cells W1-3, W1-9, and W1-15. Once the voltages associated with bitlines B3, B9, and B15 reach a predetermined steady-state level (e.g., $V_{W1-3}$), the memory cells W1-3, W1-9, and W1-15 are programmed. The voltages associated with bitlines B3, B9 and B15 are then discharged. At time t2, after the target memory cells W1-3, W1-9, and W-15 are programmed, the programming pulse P2 may be de-asserted. The target memory cells W1-5, W1-11, and W1-17 included in group G3 are sequentially programmed in a similar way as described above with respect to the target memory cells included in groups G1 and G2.

In this example, as seen from FIG. 3, each bitline B1, B3, B7, B9, B13, and B15 connected to the drains of the memory cells being programmed undergoes three stages. These three stages include a ramp-up stage, a steady-state stage, and a discharge stage. During the ramp-up stage, the bitlines connected to the drains of the memory cells being programmed are charged to increase a voltage associated with the bitlines. The charging of the bitlines is stopped when the voltages reach a steady-state voltage, after which the steady-state stage commences. The memory cells are programmed during/at the end of the steady-state stage. The voltages associated with the bitlines are discharged during the discharge stage.

As is shown in the conventional example of FIG. 3, duration of the ramp-up stage of a bitline lasts for a significant portion of the associated programming pulse. This significant duration of the ramp-up stage may result in poor programming/writing performance because the programming pulses have to be of longer duration to ensure enough time for the steady-state stage for proper programming of the memory cells. It is desirable to minimize the duration of the ramp-up stage so that the programming pulses can be shorter and, therefore, the memory cells may be programmed faster. However, the duration of the ramp-up stage may not always be minimized because this duration is based on inherent metal parasitics of the non-volatile memory cells, limitations of the supply voltages used to charge the bitline, and on requirements of the core cell technology to prevent disturbance from the memory cell being programmed to other memory cells. Ideally, multiple memory cells would be programmed in parallel, but the capacities of the available power supplies and control over the power supplies is very difficult to implement. Additional challenges in programming the memory cells include addressing management of the multiple memory cells to be programmed and the current consumption limitation associated with the device including the memory. For all the above reasons, the sequential programming of the identified memory cells can be inefficient and may result in poor programming/writing performance of the memory cells.

Embodiments of the present disclosure describe pipelining during programming of memory cells to, e.g., improve the programming/writing performance and increase throughput associated with the memory. In one embodiment, the pipelining includes partially overlapping the programming pulses, while considering the inherent metal parasitics of the non-volatile memory cells, limitations of the supply voltages used to charge the bitline, the current consumption limitation associated with the device including the memory, and on requirements of the core cell technology. The exemplary pipelining to program cells are connected to the same Wordline will now be described with respect to FIGS. 4-6.

Figure 4:
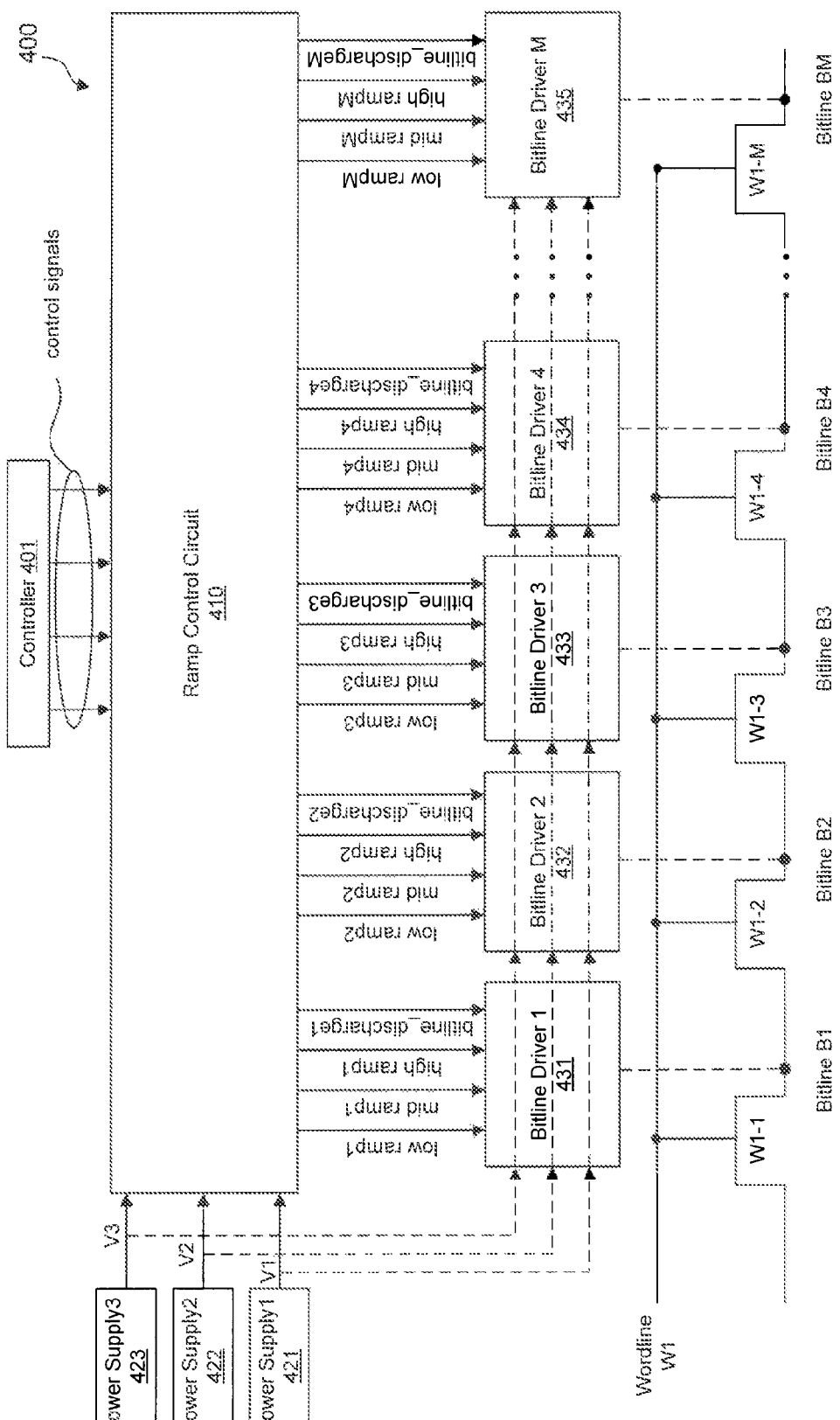
FIG. 4 illustrates an electrical system used for pipelining during programming of memory cells, according to an embodiment of the present disclosure.

FIG. 4 illustrates an electrical system 400 used for pipelining during programming of memory cells, according to an embodiment of the present disclosure. In the example shown, the electrical system 400 includes memory cells W1-1, W1-2, W1-3, W1-4 . . . W1-M, a controller 401, a ramp control circuit 410, power supplies 421, 422, and 423, and respective bitline drivers 431, 432, 433, 434, and 435 connected to the respective bitlines of the memory cells to be programmed.

The power supplies 421, 422, and 423 provide respective voltages V1, V2, V3 to the ramp control circuit 410 and/or to each of the bitline drivers 431-435. The relationship between the voltages V1, V2, and V3 may be described as V1<V2<V3, where V3 may substantially be equal to the steady-state voltage associated with the bitlines of the memory cells to be programmed. The controller 401 provides control signals to the ramp control circuit 410, which in turn provides ramp and discharge signals (e.g., lowramp, midramp, highramp, bitline_discharge) to each of the bitline drivers 431-435 based on the control signals. The bitline drivers 431-435 charge and discharge the respective bitlines associated with the memory cells to be programmed based on the received voltages V1, V2, and V3 and the ramp and discharge signals. As described below in further detail, the ramp-up stage for each bitline includes three sections (e.g., a low-voltage section, a mid-voltage section, and a high-voltage section) of charging, each section being driven by a respective power supply. For example, the power supply1 421 drives/charges the bitline through the low-voltage section to voltage V1 (e.g., 1.5 V), the power supply2 422 drives/charges the bitline through the mid-voltage section to voltage V2 (e.g., 3V), and the power supply3 423 drives/charges the bitline through the high-voltage section to voltage V3 (e.g., 4.5 V).

Figure 5:
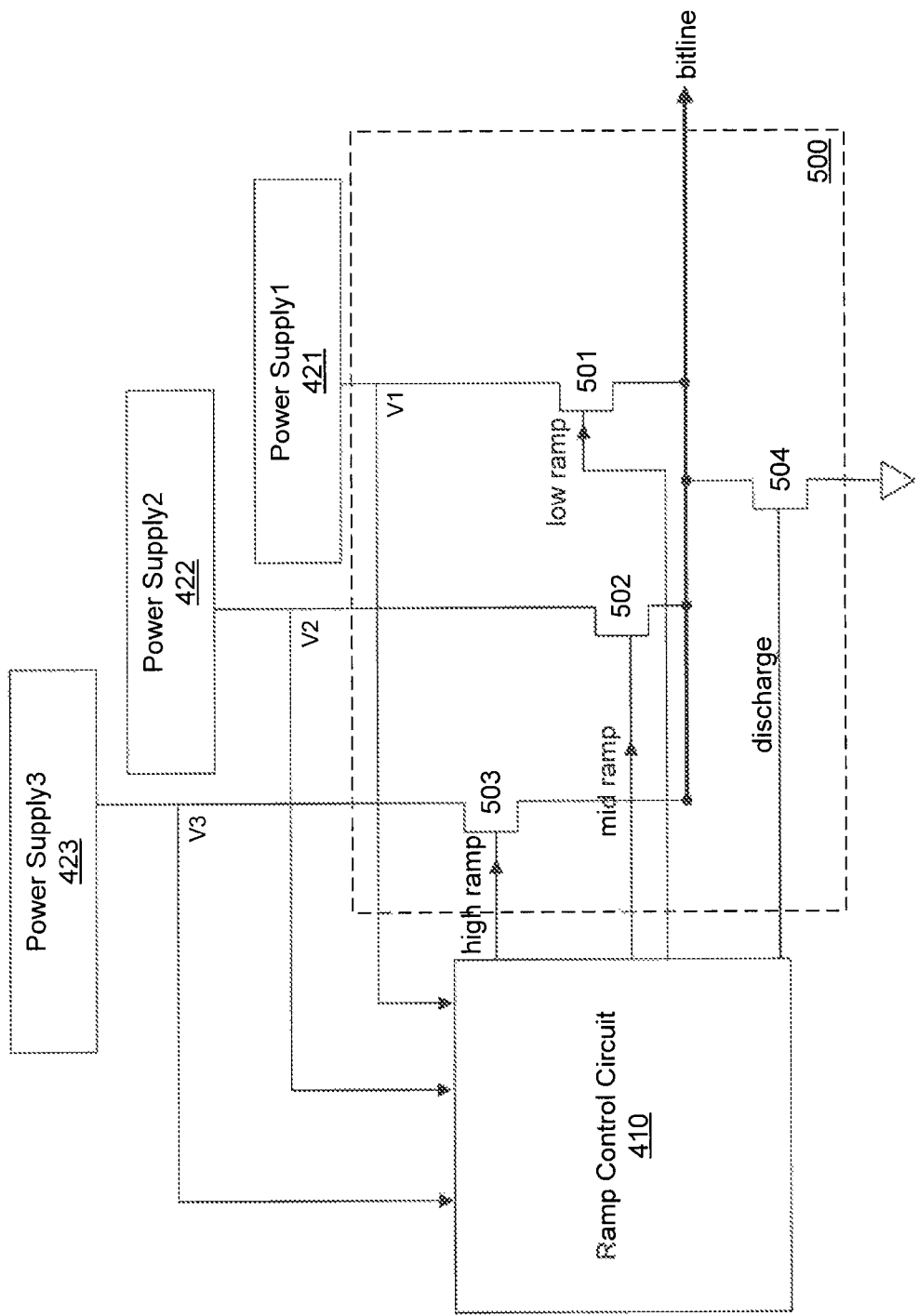
FIG. 5 illustrates an exemplary bitline driver, according to an embodiment of the present disclosure.

FIG. 5 illustrates an exemplary bitline driver 500, according to an embodiment of the present disclosure. Each bitline driver 500 may include four transistor switches 501, 502, 503, and 504 for driving a given bitline through the ramp-up, the steady-state, and the discharge stages. Transistor switches 501, 502, and 503 may be used for charging the bitline during the ramp-up stage and for maintaining the steady-state stage. For example, the drain of transistor 501 may be connected to power supply1 421 and the source of transistor 501 may be connected to the bitline that is to be driven through the low-voltage section of the ramp-up stage, the drain of transistor 502 may be connected to power supply2 422 and the source of transistor 502 may be connected to the bitline that is to be driven through the mid-voltage section of the ramp-up stage, and the drain of transistor 503 may be connected to power supply3 423 and the source of transistor 503 may be connected to the bitline that is to be driven through the high-voltage section of the ramp-up stage and is to be maintained through the steady-state voltage during the steady-state stage. Finally, the drain of transistor 504 may be connected to the bitline with the source of transistor 504 being connected to ground to discharge the bitline.

In an exemplary operation, and with reference to FIGS. 4 and 5, when all transistors are turned off, upon initiation of the ramp-up stage, the ramp control circuit 410 asserts the lowramp signal to turn on transistor 501, such that voltage V1 supplied by power supply1 421 is used to drive the bitline through the low-voltage section. Once the bitline reaches a first predetermined voltage, the ramp control circuit 410 de-asserts the lowramp signal to turn off transistor 501 and asserts the midramp signal to turn on transistor 502, such that voltage V2 supplied by power supply2 422 is used to drive the bitline through the mid-voltage section. Once the bitline reaches a second predetermined voltage, the ramp control circuit 410 de-asserts the midramp signal to turn off transistor 502 and asserts the highramp signal to turn on transistor 503, such that voltage V3 supplied by power supply3 423 is used to drive the bitline through the high-voltage section. Once the bitline reaches the steady-state voltage, the steady-state stage commences and the transistor 503 is maintained in the ON condition, so that the memory cell is programmed. The ramp control circuit 410 then de-asserts the highramp signal to turn off transistor 503 and asserts the discharge signal to turn on transistor 504 so that the bitline may be discharged.

Figure 6:
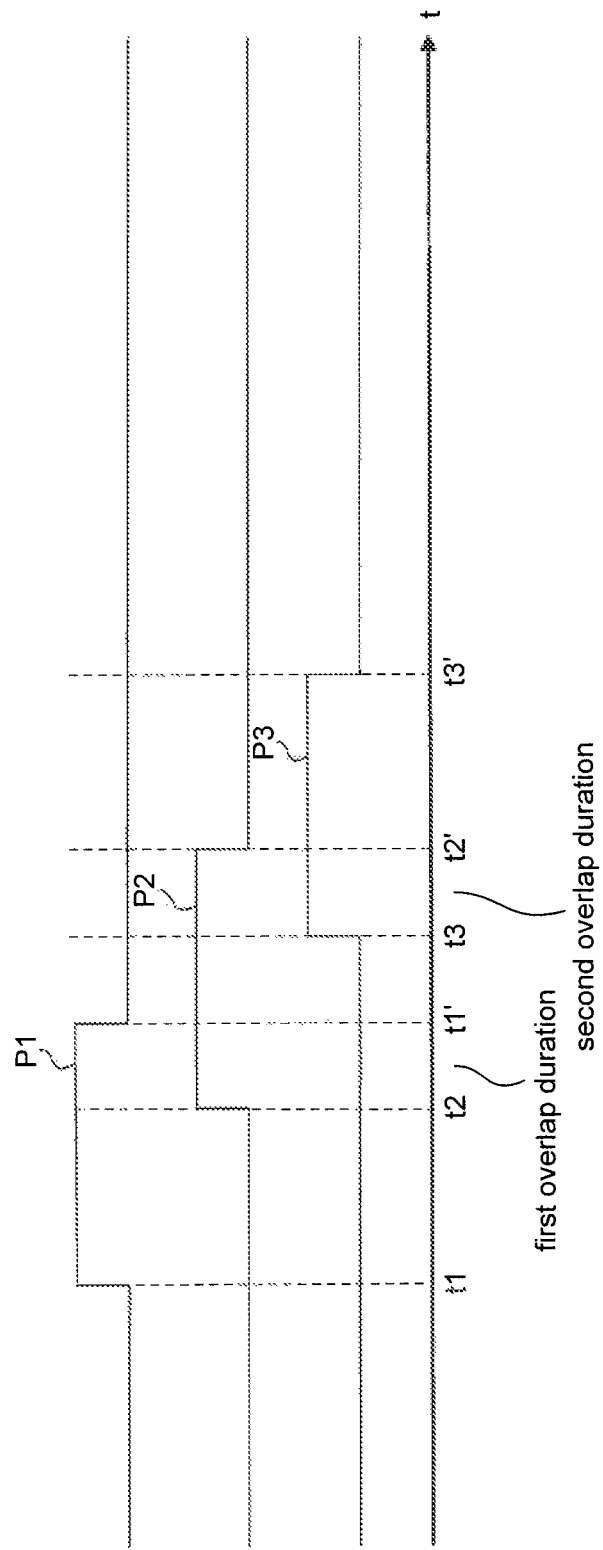
FIG. 6 illustrates exemplary programming of identified memory cells using pipelining, according to an embodiment of the present disclosure.

FIG. 6 illustrates exemplary programming of memory cells, e.g., memory cells W1-1, W1-7 (not shown), and W1-13 (not shown) included in a first group G1; memory cells W1-3, W1-9 (not shown), and W1-15 (not shown) included in a second group G2; and memory cells W1-5, W1-11 (not shown), and W1-17 (not shown) included in a third group G3 using pipelining, according to an embodiment of the present disclosure. At the outset, the controller 401 determines the locations of the above memory cells which are to be programmed. The controller 401 then generates programming pulses P1, P2, and P3 used to respectively enable programming of the identified memory cells in the respective groups G1, G2, and G3. It is to be noted that even though each of the above groups, G1, G2, and G3, are disclosed to include three memory cells that are to be programmed, each of the above groups may include any number of memory cells to be programmed. Further, in one embodiment, at least one of the above groups may include a different number of memory cells to be programmed with respect to at least another one of the above groups.

Unlike the programming illustrated in FIG. 3, the programming pulses illustrated in FIG. 6 are staggered, such that each programming pulse overlaps for a predetermined overlap duration with at least one other subsequent programming pulse. For example, programming pulse P1 that enables programming of memory cells W1-1, W1-7, and W1-13 overlaps for a first predetermined overlap duration with a subsequent programming pulse P2, which enables programming of memory cells W1-3, W19, and W1-15. In addition, pulse P2 which enables programming of memory cells W1-3, W19, and W1-15 also overlaps for a second predetermined overlap duration with a subsequent programming pulse P3, which enables programming of memory cells W1-5, W1-11, and W1-17. In one embodiment, the duration of the first predetermined overlap duration and the second predetermined overlap duration is the same, while in other embodiments these overlap durations may be different durations.

In one example, programming pulse P1 is asserted at time t1 to enable programming of memory cells W1-1, W1-7, and W1-13 and is de-asserted at time t1' when these memory cells have been programmed. Programming pulse P2 is asserted at time t2 to enable programming of memory cells W1-3, W1-9, and W1-15 and is de-asserted at time t2' when these memory cells have been programmed. As seen in FIG. 6, programming pulse P2 is asserted at time t2 before time t1'. Therefore, programming pulses P1 and P2 are staggered and overlap for the first predetermined overlap duration. Similarly, programming pulse P3 is asserted at time t3 to enable programming of memory cells W1-5, W1-11, and W1-17 and is de-asserted at time t3' when these memory cells have been programmed. As seen in FIG. 6, programming pulse P3 is asserted at time t3 before time t2'. Therefore, programming pulses P2 and P3 are staggered and overlap for the second predetermined overlap duration. In this way, the identified memory cells included in each of the groups G1, G2, and G3 are programmed.

Figure 7:
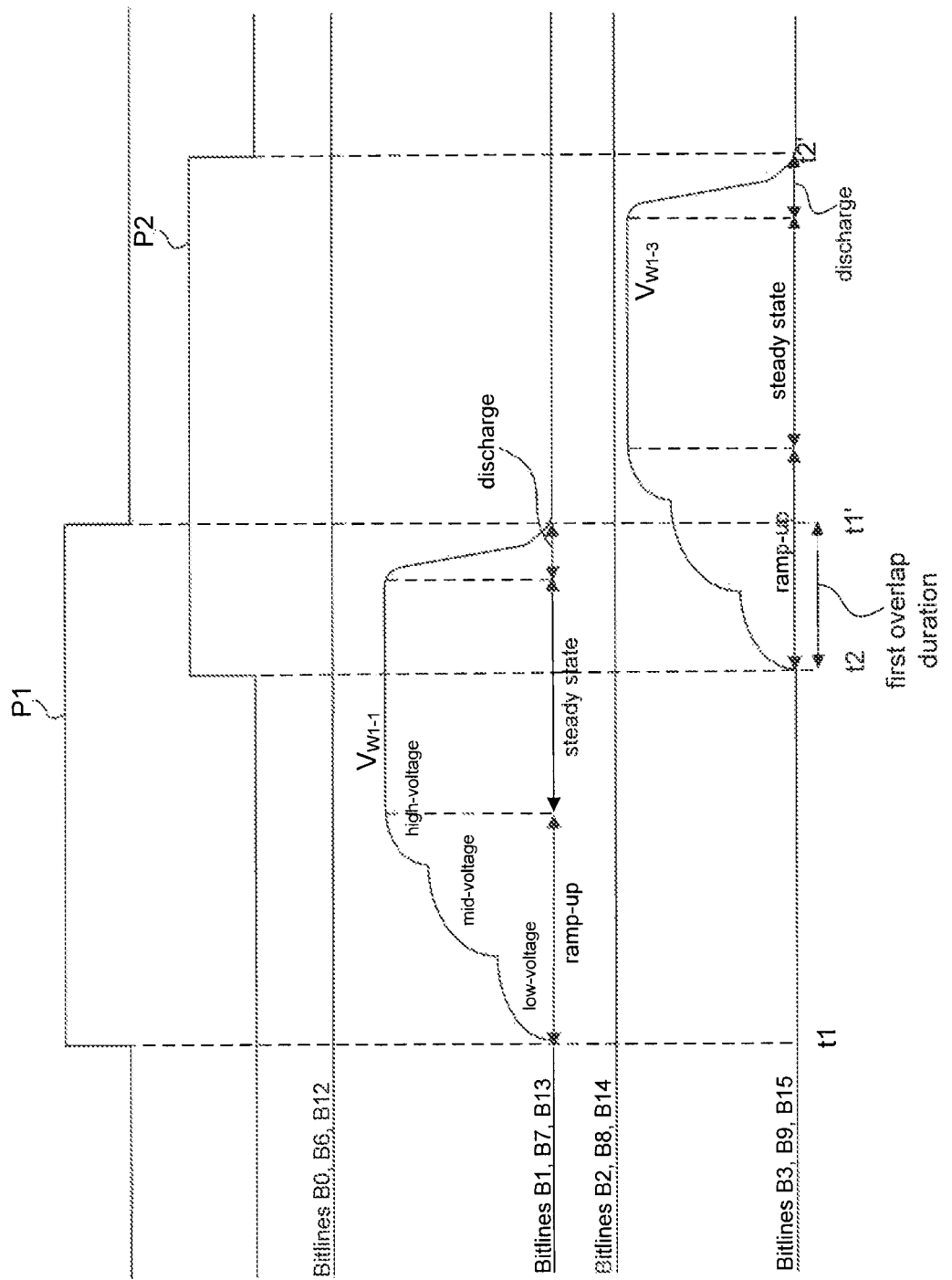
FIG. 7 illustrates further exemplary programming of the identified memory cells using pipelining, according to an embodiment of the present disclosure.

FIG. 7 illustrates programming of memory cells using pipelining, according to an embodiment of the present disclosure. The voltage associated with Wordline W1 is initially ramped up to the first high-voltage level. Then, at time t1, when pulse P1 is asserted, the voltage associated with bitlines B0, B6, and B12 which are connected to the sources of the target memory cells W1-1, W1-7, and W1-13 are maintained at a very low voltage level. Also, at time t1, the programming pulse P1 to enable programming of target memory cells W1-1, W1-7, and W1-13 is asserted to ramp-up voltages associated with bitlines B1, B7, and B13 which are connected to the drains of the target memory cells W1-1, W1-7 and W1-13.

For example, as described above with respect to FIG. 5, the bitline driver 431 asserts the lowramp1 signal to enable the power supply1 421 to charge/drive bitlines B1, B7, and B13 through their respective low-voltage sections. Once the voltages associated with bitlines B1, B7, and B13 reach V1, for example, the bitline driver 431 de-asserts the lowramp1 signal and asserts the midramp1 signal to enable the power supply2 422 to charge/drive bitlines B1, B7, and B13 through their respective mid-voltage sections. Once the voltage: associated with bitlines B1, B7, and B13 reach V2, for example, the bitline driver 431 de-asserts the midramp1 signal and asserts the highramp1 signal to enable the power supply3 423 to charge/drive bitlines B1, B7, and B13 through their respective high-voltage sections. Once the voltage associated with bitlines B1, B7, and B13 reach the steady-state level $V_{W1-1}$, for example, the ramp-up stage is concluded.

At this point, the steady-state commences and the bitline driver 431 maintains the highramp1 signal to allow the memory cells W1-1, W1-7, and W1-13 to be programmed. Now, at time t2, pulse P2 that enables programming of memory cells W1-3, W1-9, and W1-15 is asserted. Also, at time t2, the bitline driver 432 asserts the lowramp3 signal to enable the power supply1 421 to charge/drive bitlines B3, B9, and B15 through their respective low-voltage sections. Once the voltages associated with bitlines B3, B9, and B15 reach V1, for example, the bitline driver 431 de-asserts the lowramp3 signal and asserts the midramp3 signal to enable the power supply2 422 to charge/drive bitlines B3, B9, and B15 through their respective mid-voltage sections. Once the voltages associated with bitlines B3, B9, and B15 reach V2, for example, the bitline driver 431 de-asserts the midramp3 signal and asserts the highramp3 signal to enable the power supply3 423 to charge/drive bitlines B3, B9, and B15 through their respective high-voltage sections. Once the voltage associated with bitlines B3, B9, and B15 reach the steady-state level $V_{W1-3}$, for example, the ramp-up stage is concluded.

Additionally, at time t1', the bitline driver 431 de-asserts the highramp1 signal and asserts the bitline_discharge1 signal to discharge the voltage associated with bitlines B1, B7, and B13. At time t1', the memory cells W1-1, W1-7, and W1-13 included in group G1 have been programmed. At time t2', the bitline driver 431 de-asserts the highramp3 signal and asserts the bitline_discharge3 signal to discharge the voltage associated with bitlines B3, B9, and B15. At time t2', the memory cells W1-3, W1-9, and W1-15 included in group G2 have been programmed.

The programming of additional memory cells, e.g., the memory cells included in group G3 may be carried out in a similar manner as described above with respect to the programming of memory cells included in group G1 and G2. In one example, it is within the scope of the present disclosure to program groups of memory cells using respective programming pulses and/or programming individual memory cells using respective programming pulses (as discussed above) as long as the programming pulses are staggered, as proposed.

The overlap duration between times t2 and t1' is the first predetermined overlap duration during which the programming pulse P1, which programs memory cells W1-1, W1-7, and W1-13, and the programming pulse P2, which programs memory cells W1-3, W1-9, and W1-15, are staggered. It is to be noted that the illustration of any predetermined overlap duration is exemplary, and that the duration of any predetermined overlap duration may be shorter or longer as long as the steady-state stages of any two staggered pulses do not overlap. For example, the maximum overlap duration between times t2 and t1' is equal to the duration of the ramp-up stage of memory cells W1-3, W1-9, and W1-15.

Additionally or optionally, additional subsequent programming pulses may be asserted to program the identified memory cells. In this embodiment, the controller 401 may verify whether all the memory cells that are to be programmed have in fact been programmed. For example, the controller 401 may verify whether the respective threshold voltages associated with the transistors of the respective memory cells to be programmed have reached their respective predetermined threshold voltages. When the controller 401 determines that all the respective threshold voltages associated with the transistors of the respective memory cells to be programmed have reached their perspective predetermined threshold voltages, the controller 401 may not need to assert the additional subsequent programming pulses to program the memory cells.

However, when the controller 401 determines that a threshold voltage associated with a transistor of a given memory cell to he programmed has not reached its predetermined threshold voltage, the controller 401 may subsequently re-assert the complete sequence of programming pulses P1, P2, and P3 as discussed above with respect to FIG. 6. Alternatively, the controller 401 may subsequently re-assert only the programming pulse associated with the given memory cell whose threshold voltage is determined not to have reached its predetermined threshold voltage. For example, when the controller 401 determines that the threshold voltage associated with the transistor of memory cell W1-7 has not reached its predetermined threshold voltage, the controller 401 may subsequently re-assert only pulse P1 to ensure that the threshold voltage associated with the transistor of memory cell W1-7 reaches its predetermined threshold voltage. After the re-assertion of the relevant subsequent programming pulses, the controller 401 may once again verify whether the respective threshold voltages associated with the transistors of the respective memory cells to be programmed have reached their respective predetermined threshold voltages.

In one example, it is within the scope of the present disclosure to program groups of memory cells using respective programming pulses and/or programming individual memory cells using respective programming pulses (as discussed above) as long as the programming pulses are staggered, as proposed.

In another example, the proposed pipelining during programming of memory cells improves the programming/writing performance and increases throughput associated with the memory. For example, the partial (or substantially complete) overlapping of the programming pulses, while being mindful of the inherent metal parasitics of the non-volatile memory cells, limitations of the supply voltages used to charge the bitline, the current consumption limitation associated with the device including the memory, and the requirements of the core cell technology allows faster and more efficient programming of the memory cells. For example, some memory architectures allow for only a given delta in voltage at a given time between voltages applied across the memory cells to avoid structural damage to the memory.

In a further example, predetermined overlap durations may be dynamically adjusted or customized based on the behavior of the non-volatile memory cells during, for example, the ramp-up and steady-state stages. Additionally or alternatively, the predetermined overlap durations may be dynamically adjusted based on environmental operating conditions of the system such as ambient temperature. Additionally or alternatively, the predetermined overlap durations may be dynamically adjusted based on a threshold voltage distribution of respective transistors associated with the memory cells and/or a predetermined current consumption by a memory comprising the memory cells to be programmed.

Figure 8:
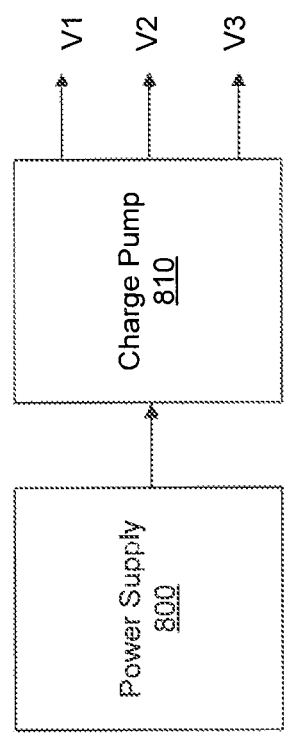
FIG. 8 illustrates a charge pump, according to an embodiment of the present disclosure.

FIG. 8 illustrates a charge pump 810, according to an embodiment of the present disclosure. As an alternate to using three separate power supplies, power supply1, power supply2, and power supply3, a single power supply 800 may be used along with a charge pump 810 to generate voltages V1, V2, and V3 that drive the bitlines of the memory cells to be programmed. The charge pump concurrently and individually regulates the single power supply 800 based on the required output voltages V1, V2, and V3.

It is to be appreciated that the Detailed Description section, and not the Summary and Abstract sections, is intended to be used to interpret the claims. The Summary and Abstract sections may set forth. one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A system comprising:
   a memory cell array including a plurality of memory cells; and
   a writing device configured to generate multiple back-to-back write pulses configured to write to target memory cells from among the plurality of memory cells, the multiple back-to-back write pulses overlapping during an overlap duration, the overlap duration being configured to be adjusted based on a performance parameter of the memory cell array,
   wherein, during the overlap duration, a ramp-up period of a bitine associated with writing to a subsequent target memory cell substantially overlaps a steady-state period of a bitline associated with writing to a current target memory cell.

2. The system of claim 1, wherein the performance parameter comprises a current required to pre-charge and to program a target memory cell.

3. The system of claim 1, wherein the performance parameter comprises a current required to pre-charge and to erase a target memory cell.

4. The system of claim 1, wherein the performance parameter comprises a predetermined current consumption by a memory comprised of the memory cell array.

5. The system of claim 1, wherein the ramp-up period of the bitline associated with writing to the subsequent target memory cell includes a plurality of ramp-up stages, the plurality of ramp-up stages being driven by respective ramp-up voltages.

6. The system of claim 1, comprising:
   a ramp control circuit configured to:
      receive a plurality of ramp-up voltages; and
      drive, during the ramp-up period, a plurality of ramp-up stages of the bitline associated with writing to the subsequent target memory cell by applying a respective one of a plurality of ramp-up voltages.

7. The system of claim 6, wherein the ramp control circuit is configured to sequentially apply the plurality of ramp-up voltages to drive the plurality of ramp-up stages.

8. The system of claim 6, wherein the ramp control circuit is configured to receive the plurality of ramp-up voltages from respective independent voltage supplies, each independent voltage supply having a respective regulator.

9. The system of claim 6, wherein the ramp control circuit is configured to receive the plurality of ramp-up voltages from a single voltage supply generating the plurality of ramp-up voltages, each ramp-up voltage being regulated independently.

10. A method in a system for writing to memory cells, the method comprising:
generating back-to-back first and subsequent write pulses to enable writing to target memory cells, the first and subsequent programming pulses overlapping during an overlap duration that is adjustable based on a performance parameter of the system; and
writing to the target memory cells using the first and subsequent write pulses,
wherein the writing includes substantially overlapping, during the overlap duration, an ramp-up period of a bitline associated with writing to a subsequent target memory cell with a steady-state period of a bitline associated with writing to a current target memory cell.

11. The method of claim 10, wherein the performance parameter comprises a current required to precharge and program a target memory cell.

12. The method of claim 10, wherein the performance parameter comprises a current required to precharge and to erase a target memory cell.

13. The method of claim 10, wherein the performance parameter comprises a predetermined current consumption by a memory comprised of the memory cell array.

14. The method of claim 10, wherein the ramp-up period of the bitline associated with writing to the subsequent target memory cell includes a plurality of ramp-up stages, the plurality of ramp-up stages being driven by respective ramp-up voltages.

15. The method of claim 10, comprising:
receiving a plurality of ramp-up voltages; and
driving, during the ramp-up period, a plurality of ramp-up stages of the bitline associated with writing to the subsequent target memory cell by applying a respective one of the plurality of ramp-up voltages.

16. The method of claim 15, wherein the applying comprises sequentially applying the respective one of the plurality of ramp-up voltages to drive the plurality of ramp-up stages.

17. The method of claim 15, wherein the receiving a plurality of ramp-up voltages includes receiving the plurality of ramp-up voltages from corresponding respective voltage supplies.

18. The method of claim 15, wherein the receiving a plurality of ramp-up voltages includes receiving the plurality of ramp-up voltages from a single voltage supply generating the plurality of ramp-up voltages, each ramp-up voltage being regulated independently.

* * * * *